US009388951B2

(12) United States Patent
Yamada

(10) Patent No.: US 9,388,951 B2
(45) Date of Patent: Jul. 12, 2016

(54) STACKED ASSEMBLY OF LIGHT EMITTING DEVICES

(71) Applicant: NICHIA CORPORATION, Anan-shi, Tokushima (JP)

(72) Inventor: Motokazu Yamada, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 164 days.

(21) Appl. No.: 14/184,842

(22) Filed: Feb. 20, 2014

(65) Prior Publication Data

US 2014/0231835 A1    Aug. 21, 2014

(30) Foreign Application Priority Data

Feb. 21, 2013  (JP) ................................. 2013-032080

(51) Int. Cl.

| H01L 33/48 | (2010.01) |
| H01L 33/52 | (2010.01) |
| F21K 99/00 | (2016.01) |
| H05K 1/14  | (2006.01) |
| G02F 1/1335 | (2006.01) |
| F21V 31/00 | (2006.01) |
| F21Y 101/02 | (2006.01) |
| F21Y 103/00 | (2016.01) |
| H05K 1/18  | (2006.01) |

(52) U.S. Cl.
CPC ............ *F21K 9/90* (2013.01); *G02F 1/133603* (2013.01); *H05K 1/144* (2013.01); *F21V 31/005* (2013.01); *F21Y 2101/02* (2013.01); *F21Y 2103/003* (2013.01); *H05K 1/189* (2013.01); *H05K 2201/09063* (2013.01); *H05K 2201/10106* (2013.01); *H05K 2201/2054* (2013.01)

(58) Field of Classification Search
CPC . H01L 25/075–25/0756; H01L 33/00–33/648; F21K 9/00–9/90; F21V 31/005; F21Y 2101/02; F21Y 2103/003; G02F 1/133603
See application file for complete search history.

(56) References Cited

U.S. PATENT DOCUMENTS

| 6,767,112 B2 * | 7/2004 | Wu ......................... F21V 14/04 257/E25.02 |
| 7,273,987 B2 * | 9/2007 | Becker .................. H05K 1/0204 174/252 |
| 7,942,552 B2 * | 5/2011 | Sugai ........................ F21K 9/00 362/249.02 |
| 9,161,458 B2 * | 10/2015 | Miyata ...................... H05K 3/32 |
| 2010/0072416 A1 * | 3/2010 | Fujioka ................. C08L 101/12 252/67 |

(Continued)

FOREIGN PATENT DOCUMENTS

| JP | 2006-100052 A | 4/2006 |
| JP | 2011-228602 A | 11/2011 |
| JP | 2012-142362 A | 7/2012 |

*Primary Examiner* — Eric Ward
(74) *Attorney, Agent, or Firm* — Global IP Counselors, LLP

(57) ABSTRACT

A stacked assembly of light emitting devices includes a first light emitting device, a second light emitting device and a sealing member. The first light emitting device includes a first substrate member extending in a longitudinal direction and defining a plurality of through-holes, and a plurality of first light emitting elements arranged on the first substrate member. The second light emitting device is arranged to overlap with the first light emitting device. The second light emitting device includes a second substrate member extending in the longitudinal direction, and a plurality of second light emitting elements arranged on the second substrate and exposed respectively through the through-holes. The sealing member seals the first light emitting elements and the second light emitting elements.

15 Claims, 7 Drawing Sheets

(56) References Cited

U.S. PATENT DOCUMENTS

| | | | | |
|---|---|---|---|---|
| 2010/0277673 A1* | 11/2010 | Hoelen | C04B 35/44 | 349/68 |
| 2010/0317132 A1* | 12/2010 | Rogers | H01L 25/0753 | 438/27 |
| 2011/0101383 A1* | 5/2011 | Hermann | H01L 25/0756 | 257/88 |
| 2012/0025219 A1* | 2/2012 | Herrmann | H05K 1/183 | 257/88 |
| 2012/0075836 A1* | 3/2012 | Uemura | F21K 9/17 | 362/84 |
| 2012/0286298 A1* | 11/2012 | Pang | H01L 51/5203 | 257/88 |
| 2014/0160749 A1* | 6/2014 | Lee | G02F 1/133611 | 362/235 |

* cited by examiner

STACKED ASSEMBLY OF LIGHT EMITTING DEVICES

CROSS-REFERENCE TO RELATED APPLICATION

This application claims priority to Japanese Patent Application No. 2013-032080, filed on Feb. 21, 2013. The entire disclosure of Japanese Patent Application No. 2013-032080 is hereby incorporated herein by reference.

BACKGROUND OF THE INVENTION

1. Technical Field

The present disclosure relates to a light emitting device.

2. Background Art

There have been known a light emitting device having a plurality of light emitting elements which are arranged on a flexible substrate member (see JP2011-228602A). In JP2011-228602A, a roll-to-roll method is adopted, in which while unwinding a flexible substrate member from a roll, a plurality of light emitting elements are arranged on the flexible substrate, and then the flexible substrate is rewind into a roll. Such a rewound light emitting device can facilitate handling in storage and in transportation.

SUMMARY OF THE INVENTION

A stacked assembly of light emitting devices according to one aspect includes a first light emitting device, a second light emitting device and a sealing member. The first light emitting device includes a first substrate member extending in a longitudinal direction and defining a plurality of through-holes, and a plurality of first light emitting elements arranged on the first substrate member. The second light emitting device is arranged to overlap with the first light emitting device. The second light emitting device includes a second substrate member extending in the longitudinal direction, and a plurality of second light emitting elements arranged on the second substrate and exposed respectively through the through-holes. The sealing member seals the first light emitting elements and the second light emitting elements.

DETAILED DESCRIPTION OF EMBODIMENTS

Figure 1A:
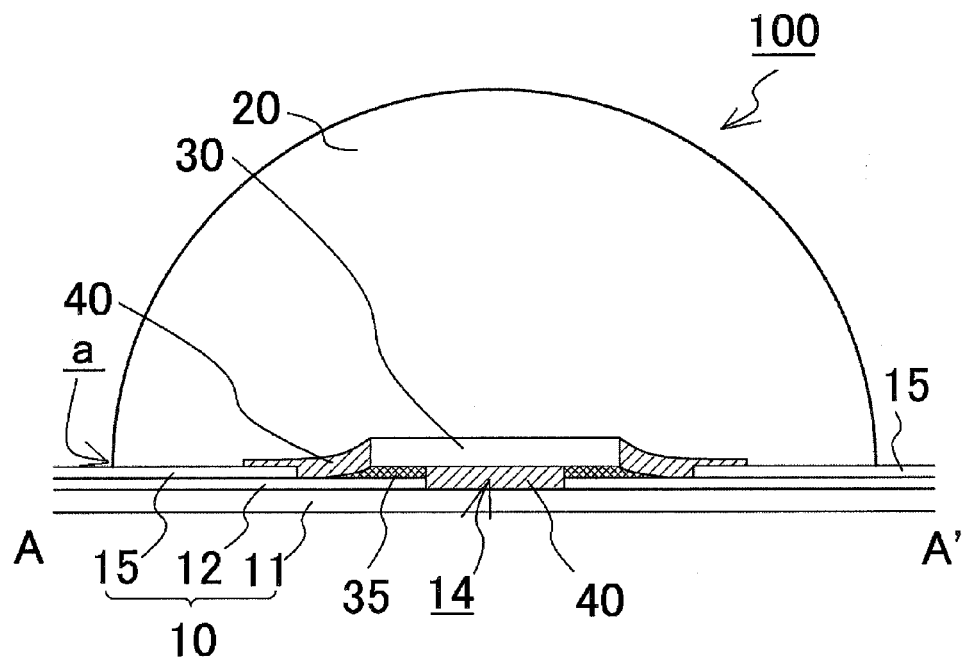
FIG. 1A is a schematic cross-sectional view taken along line A-A', of a light emitting device shown in FIG. 1B, according to an embodiment.

A stacked assembly of light emitting devices according to an embodiment of the present invention is constituted with stacking two or more light emitting devices. The two or more light emitting devices may be attached with each other or engaged to each other. The two or more light emitting devices have approximately a same main structure. Hereinafter, the structure of the light emitting device will be described. The light emitting device includes mainly, a substrate member, a light emitting element, a resin layer, and a sealing member.

Substrate Member

The substrate member includes at least a base member, a plurality of wiring portions disposed on the base member, and a covering layer disposed on the wiring portions. The substrate member is preferably a so-called flexible substrate member.

The base member is a member to serve as a base of the light emitting device and has flexibility. As long as the flexibility can be maintained, the base member can be formed by using an appropriate material according to the purpose and applications, and also in view of mounting of the light emitting element, the reflectance, adhesiveness with other members. Examples of such material include an insulating or conductive material such as plastic and metal foil. More specifically, a resin such as polyethylene terephthalate and polyimide may be preferably used. Particularly, in the case where solder is used for mounting light emitting elements, polyimide, which has high thermal resistance, is more preferably used. In addition, a material having high optical reflectance (for example, a white filler such as titanium oxide) may be contained in the material constituting the base member.

The thickness of the base member can be in a range so as not to impair the flexibility, and for example, the thickness of about 10 μm to 500 μm can be employed, and about 10 μm to 200 μm or further about 10 μm to 100 μm is preferable, or is preferably in a film-shape.

The base member can be made with an appropriate shape (size, length, width) according to the aim and applications. The base member substantially defines the shape of the substrate member, and the example of the shape include a quadrangular shape, a rectangular shape, a polygonal shape, a circular shape, an elliptical shape, or a shape which is a combination of these shapes. In the case where the light emitting device according to an embodiment of the present invention is used for straight tube-type lighting equipments, an elongated shape extending in the longitudinal direction can be preferably employed. For example, the ratio in the longitudinal direction to the lateral direction can be about 5 to 200:1, and about 5 to 100:1, about 10 to 30:1 or about 10 to 20:1 is more preferable. A flexible base member can be used in a deformed state such as in a curved or bent state. Therefore, in the case where one light emitting device to be arranged, the flexible base member having a width and length about several mm to several cm larger than the width and length of the housing member of the device can be used. Also, even in the case where a plurality of light emitting devices are to be arranged, the outermost periphery of the devices can be about several mm to several cm larger than the housing member of the devices.

For example, in the case of light source for straight tube-type lighting, more specifically, in the case of a straight tube-type lighting of about 120 cm in length (a 40-type), one light emitting device employing a base member of 0.5 cm to 5 cm in width and 100 cm to 150 cm in length can be used, or a plurality of light emitting devices each employing a base member of 0.5 cm to 5 cm in width and 20 cm to 70 cm in length can be used.

For the backlight light source for liquid crystal display televisions, an appropriate shape (size, length, and width) can be employed corresponding to the size (the number of inches) of the liquid crystal panel to be used. For example, in the case where the light emitting device is used for the backlight of a 55-inch liquid crystal display television in direct illumination-type application, 15 base members each having a width of 80 mm and a length of 680 mm may be employed, or 30 base members each having a width of 40 mm and a length of 680 mm may be employed.

In a similar manner, in the case where the light emitting device is used for the backlight of a 55-inch liquid crystal display television in edge-type application, 4 base members each having a width of 3 mm to 20 mm and a length of 340 mm may be employed, or 2 base members each having a width of 3 mm to 20 mm and a length of 680 mm may be employed.

The flexible base member can be manufactured by using roll-to-roll method, in which several units of such an elongated base member (substrate member) can be processed together. In this case, sprocket holes may be formed in the base member.

A plurality of wiring portions are formed as electrically conductive members, arranged on one surface of the base member and directly or indirectly connected to the light emitting element. The wiring portions may be made of an electrically conductive thin layer having a single-layer structure or a stacked-layer structure of metal such as copper or aluminum or alloy thereof. In the case where the wiring portion and the bonding portion overlap with each other, an insulating member is needed to apply so as not causing short circuit. The adhered portion may be employed to establish electrical continuity between the two substrate members.

It is preferable that the wiring portions have a thickness which does not impair their flexibility and, for example, a thickness of about 8 μm to 150 μm can be employed.

The shape (pattern) of the plurality of wiring portions is not specifically limited, and generally, a similar shape or a shape conforming to the shape or pattern of the wiring of the substrate members etc., for mounting the light emitting elements, or for connecting to the light emitting elements, further, in consideration of heat dissipation and/or mechanical strength can be preferably employed. For example, a crank shape; a polygonal shape such as a triangular shape, and a quadrangular shape; a shape with no sharp corners such as a circular shape and an elliptical shape; and a shape of those with partially irregular shape can be employed singly or in combination. The corners of the wiring portions are preferably rounded.

The plurality of wiring portions are arranged spaced apart from each other. Such wiring portions are constituted with a pair of positive and negative wiring portions, and the number of the wiring portions which constitute the pair of the wiring portions is not specifically limited. For example, each of the pair of wiring portions may be constituted with a single wiring portion or a plurality of wiring portions.

Arranging the wiring portions in a relatively large area with a combination of wiring portions having various shapes can increase the degree of freedom in arrangement of the light emitting device. For example, with a rectangular base member, it can be possible that six light emitting elements are arranged three in the longitudinal direction and two in the lateral direction as one block and connected in parallel, then, twelve blocks are arranged in the longitudinal direction and connected in series by the pair of positive and negative wiring portions. It may be such that the base member has an approximately square shape, an approximately circular shape, or standard positive and negative wiring portions respectively.

In addition to the wiring portions directly or indirectly electrically connected to corresponding light emitting elements (that is, the wiring portions for providing electrical continuity), a wiring portion which has a similar shape or a different shape and does not contribute to conduction of electricity and may also be arranged. The wiring portion which does not contribute to providing electrical continuity can serve as a heat releasing member or a mounting portion for some of the light emitting elements. For example, in the case where the base member has an elongated shape extended in the longitudinal direction, the wiring portions which do not contribute to providing electrical continuity are preferably arranged extended to the longitudinal end portions and at the both sides of the wiring portions in the lateral direction. The wiring portions preferably have terminals which respectively allow supply of electricity to the wiring portions. This arrangement allows supply of electricity to light emitting elements from external power source.

In the case where a part of such wiring portions are arranged on approximately the entire surface of the flexible base member (preferably arranged without having a gap), stress due to bending of the substrate member etc., loaded on the light emitting elements and the sealing member to be described later can be reduced. More specifically, in the base member having an elongated shape extending in the longitudinal direction, the wiring portions are preferably arranged elongated along the longitudinal direction of the base member, and more preferably, the wiring portions are arranged with a length of ⅓ to 1 of the longitudinal length of the base member.

As described above. on one surface of the base member, the plurality of wiring portions are spaced apart from each other and the separation creates grooves where the wiring portions are not disposed (in other words, portions where the base member is exposed). The grooves are arranged between the wiring portions, so that the shapes of the grooves are in conformity to the shapes of the wiring portions, which may be, for example, a crank shape. The width of the grooves is preferably narrower than the width of the wiring portions, in other words, the wiring portions are preferably provided with a large area, and for example, a width of about 0.05 mm to 5 mm may be employed.

The wiring portions are not provided in the grooves, and for this reason, bending tends to occur along the groove portions. For this reason, at the time of stacking the first light emitting device and the second light emitting device, the groove portions of the first substrate member and the groove portions of the second substrate member are preferably arranged not to overlap each other. With this arrangement, the groove portions of one substrate member can be strengthen with the wiring portion of the other substrate member, and bending of the substrate member can be prevented.

The wiring portions (both wiring portions that contribute to electrical continuity and wiring portions that not contribute to electrical continuity) are preferably arranged on the base member respectively with the largest possible area, so that heat dissipation can be improved.

Further, in the case where the a flexible substrate member is used, because the wiring portions are arranged on an entire surface of one surface of the base member with relatively large areas so that appropriate strength can be added to the base body while maintaining its flexibility. Thus, disconnection of wiring portions and breakage of substrate member due to bending of the flexible substrate member can be prevented effectively. More specifically, with respect to the area of the base member, the wiring portions are arranged with an area preferably 50% or greater, more preferably 70% or greater, further preferably 80% or greater, 85% or greater, or 90% or greater. Also, in the case where electrical isolation is needed between the wiring portions, in order to secure the isolation, the wiring portions are preferably disposed with the areas of about 99% or less, about 98% or less, or about 95% or less. Particularly, stacking two or more light emitting devices each having a large area of the wiring portion, heat dissipating performance can be significantly improved.

The covering layer covering the wiring portions preferably can serve as a reflective layer to reflect the light emitted from the light emitting element. It is preferable that the covering layer has, as described later, an opening where the wiring portions are exposed, and except for the opening, the covering portion covers approximately the entire surface of the substrate member. In addition, it is preferable that the covering portion also covers the grooves between the wiring portions.

In order to connect the light emitting element with a pair of positive and negative wiring portions, the opening is arranged to expose the wiring portions. The shape and size of the opening is not specifically limited, but a minimum size sufficient for electrical connection of the light emitting element with the wiring portions is preferable.

The number of the openings provided for one substrate member is not specifically limited and for example, appropriately determined according to the number of the light emitting elements to be mounted on one substrate member.

Generally, the number and arrangement of light emitting elements are adjusted according to the output power, light distribution, or the like, and accordingly, the number and the positions of the openings are determined. The number of the openings can either be the same or different with respect to the number of the light emitting elements to be mounted. For example, in the case where twenty light emitting elements to be mounted with one light emitting element in one opening, 20 openings can be arranged in the covering layer. Or in the case where two or more light emitting elements to be mounted in one opening, 10 or less openings can be arranged.

In some cases, the light emitting elements may not be mounted in the openings. For example, in the case where the light emitting devices are manufactured in several ranks (for example, light emitting devices of different outputs), with the use of the same type of the substrate member (that is, the number and arrangement of the openings provided in the covering layer), different optical output can be obtained by changing the number of the light emitting elements to be mounted in the openings. In this case, some openings may not have any light emitting elements mounted therein. A region lacking the covering layer (i.e. an opening) may be formed in a region for arranging a member or the like, such as the terminal described above, which supplies electricity to the light emitting elements.

In the case of flip-chip mounting, a part of groove is preferably exposed through a single opening.

The covering layer can be formed by using a resin such as a phenol resin, an epoxy resin, a BT resin, a PPA, a silicone resin or a urea resin. Also, the covering layer is preferably made of a material which reflects emission of the light emitting element and wavelength-converted light by a wavelength converting member to be described later. For this reason, a filler such as $SiO_2$, $TiO_2$, $Al_2O_3$, $ZrO_2$, or $MgO$ is preferably contained in the resin described above.

The covering layer is preferably disposed with a relatively small thickness, and particularly preferable that the covering layer is disposed so that the upper surface of the light emitting element is higher than the covering layer. More specifically, the thickness of the covering layer may be about 5 μm to 50 μm.

The substrate member having such a structure has flexibility. This arrangement allows its use in various applications, with in situ shape with the light emitting element mounted thereon or with a shape appropriately changed. The total thickness of the substrate member can be adjusted according to the thickness of each of the components described above, and for example, about 0.05 mm to 0.15 mm, preferably about 0.07 mm to 0.12 mm can be employed. The substrate member may be formed by stacking the base member, the wiring portions, and the covering layer which are described above with applying an adhesive agent etc. (for example, a silicone-based adhesive agent, an epoxy-based adhesive agent, or an acrylic-based adhesive agent, with a thickness of several micrometers to several tens of micrometers) between them, or by stacking them with the use of plating, thermal compression, or the like.

The weight of the substrate member can be appropriately adjusted according to the materials and thickness of the base member, the wiring portions, and the covering layer, and the size and number of the openings, and for example, a weight of 1 $g/cm^2$ or less, 0.7 $g/cm^2$ or less, 0.4 $g/cm^2$ or less, 0.1 $g/cm^2$ or less, is preferably employed. Accordingly, even with an addition of the weight of the light emitting elements etc., to be mounted on the substrate member, a light emitting device of very light weight can be realized.

In the present embodiment two light emitting devices are assumed to be used stacked. For example, more specifically, the surface of the second light emitting device is attached to the back-surface of the first light emitting device with the use of an acrylic adhesive agent, an epoxy-based adhesive agent, an urethane-based adhesive agent, or a silicone-based adhesive agent, or with the use of double-sided adhesive tape. For this purpose, through-holes for exposing the light emitting elements of the second light emitting device on the surface of the first light emitting device are defined in the substrate member of the first light emitting device.

The through-holes penetrate from the upper surface to the back-surface of the light emitting device. The through-holes of a size which can accommodate the sealing members respectively are preferable, but of a size which allows passage of the emission light of the light emitting elements are sufficient. Therefore, the through-holes are sufficient to be larger than the light emitting elements and the upper portion of the sealing members may be either protruding or not protruding from the respective through-holes.

Also, in consideration of flexure at the time of winding, the through holes may be made longer in the longitudinal direction.

The locations of the through holes in the first light emitting device are made corresponding to the locations of the light emitting elements of the second light emitting device. Therefore, in the case where a plurality of light emitting elements are arranged along the longitudinal direction in the second light emitting device, the first light emitting device preferably defines a plurality of through holes arranged along its longitudinal direction. In this case, the pitch of the through-holes preferably matches the pitch of the light emitting elements, but is sufficient that the pitch of the through-holes is an integral multiple of the pitch of the light emitting elements.

The through holes are preferably made avoiding the wiring portions. This is because exposing the wiring portion at the inner edge of the through-holes may cause short circuit.

The structure of the first light emitting device and the structure of the second light emitting device may differ with each other. For example, in the case where the upper surface of the second light emitting device is attached to the back-surface of the first light emitting device, the second light emitting device may not necessarily be provided with the through holes. Also, a part of the upper surface of the second light emitting device attached to the back-surface of the first light emitting device is not exposed at the surface, so that a covering layer which serves as the reflecting layer is not necessarily provided.

Light Emitting Element

A plurality of light emitting elements are arranged on the substrate member, and electrically connected to parts of the wiring portions which are not covered by the covering layer. Particularly, in the above-described openings of the covering layer on the substrate member, the light emitting elements are preferably arranged respectively on the two wiring portions in a bridged manner or arranged on a single wiring portion. With such arrangements, the light emitting elements can be electrically connected easily to the pair of positive and negative wiring portions respectively.

The number and/or tone of color tone and/or arrangement of a plurality of light emitting elements are determined to satisfy the output and light distribution designed for the light emitting device. It is therefore accordingly the shape and arrangement of the wiring portions and/or openings of the covering layer are adjusted and the light emitting elements are mounted at the determined positions.

The light emitting element includes a semiconductor structure, a p-side electrode, and an n-side electrode.

The semiconductor structure, for example, includes an n-type layer, an active layer, and a p-type layer respectively made of a gallium nitride-based semiconductor and stacked in the order on a light-transmissive sapphire substrate. It is not limited to a gallium nitride-based semiconductor, but also, a group II-VI-based semiconductor or a group III-V-based semiconductor may be used.

The n-side electrode and the p-side electrode can be formed with a single layer or staked-layer of known materials.

The light emitting element may be mounted on the substrate member in a flip-chip manner or a face-up manner.

In the case of flip-chip mounting, the p-side electrode and the n-side electrode of the light emitting element are connected to a pair of wiring portions via a pair of bonding member respectively. For the bonding member, for example, a solder of Sn—Ag—Cu-based, Sn—Cu-based, or Au—Sn-based, or a metal bump such as Au can be used.

In the case of face-up mounting, the light emitting element is fixed on the base member (on the wiring portion) by an insulating bonding member such as a resin or by an electrically conductive bonding member as described above, and then, electrically connected to the wiring portions via wires. In the case where the substrate member of the light emitting element is electrically conductive, the light emitting element is electrically connected by the bonding member as described above.

In addition to the light emitting elements, an electrical component (including the protective element and the related components describe above) may be arranged on one surface of the substrate member. Such an electrical component may be arranged together with the light emitting element in the opening where the light emitting element is mounted or in a different opening provided separately. But, the electrical component is preferably arranged at a location so as not to absorb much light from the light emitting element. The protective element is preferably arranged at an appropriate position, for example, one protective element is mounted on a wiring portion, to which a plurality of light emitting elements are connected in series, at a position near a connector regardless of the arrangement of the light emitting elements.

The brightness of the light emitting elements can be adjusted by the structure, the constituent materials, the applied voltage, or the like. Also, the brightness of the light emitting device itself can be adjusted by increasing or decreasing the number of the light emitting elements. Thus, in the case of a straight-tube-type (40 W type) light source for lighting, the light emitting device according to the embodiments of the present invention can realize a total brightness of the light emitting elements 3,000 lm or greater at a color temperature of 5,000K, by appropriately adjusting the type and/or the number of the light emitting elements. Accordingly, while maintaining equivalent or greater performance than the fluorescent lamps of various types such as straight-tube types, circular types, and compact types that have been conventionally used, the light emitting devices of the embodiments can offer smaller size and weight, and can be used in various application sites or locations or conformations.

Also, in the case of a light source for backlight, the total brightness of the light emitting elements can realize 9,000 lm or greater at a color temperature of 20,000 K. Accordingly, the degree of freedom can be further expanded compared to that of the LED modules in which LEDs are mounted on a rigid substrate member made of such as glass epoxy, or further, compared to that of the conventional fluorescent lamps and cold-cathode tubes, and thus applications at various sites, locations and conformations which can not be realized in the conventional fluorescent lamps etc., become possible.

For example, the number (density) of the light emitting elements in one light emitting device can be 0.05 to 10 light emitting elements/cm$^2$. With the use of the substrate member described above, appropriate adjustments of the strength for the light emitting elements, heat dissipation of the light emitting element, supply of electricity, etc., become possible, so that such a density of the light emitting elements can be realized.

Also, the two light emitting devices are stacked in use, which allows an easy increase of the density of the light emitting elements. As described above, the density of the light emitting elements is increased by stacking the two light emitting devices, thus, a higher brightness than that described above can be obtained.

In the case where a same level of brightness is sufficient to obtain, and where two light emitting devices are stacked in use, the density of the light emitting elements in each light emitting device can be reduced to a half. In this case, the light emitting devices are not needed to be made with a complex, micromachining structure, and for example eases arrangement of the wirings, thus, the cost of manufacturing of the light emitting devices can be reduced. Also, the density of the light emitting elements in each light emitting device can be reduced, so that heat dissipating performance can be enhanced and thus influence from the heat generated by the light emitting elements can be reduced.

Further, two light emitting devices can be controlled separately, which allows not only turning on all the light emitting elements of the two light emitting devices but also, for example, turning on the light emitting elements of only one light emitting devices, or alternately turning on the light emitting elements of the two light emitting devices.

Resin Layer

The resin layer may be disposed laterally (outer periphery) to the light emitting element, for example, in the openings formed in the covering layer, outer periphery of the openings, or from the inner side of the openings toward the outer periphery of the openings, that is, extending onto the covering layer. Also, regardless of the presence of the wiring portions, the resin layer may be disposed, for example, in the groove portion between the wiring portions and/or directly under the light emitting element.

The resin layer is preferably in contact with the outer edge (side surfaces) of the light emitting element. Generally, the light emitting element is mounted on the substrate member by using a bonding member etc., but compared to the material constituting the resin layer, a part of the surfaces of the bonding member and/or the base member (for example, the wiring portions etc.,) generally tends to develop deterioration caused by light. For this reason, the resin layer is preferably arranged so that in the vicinity of the light emitting element, a part of the surface etc., of the bonding member and/or the base member is covered with the resin layer. With this arrangement, the relatively intense light emitted from the light emitting element can be prevented from directly irradiating the bonding member and/or the base member, so that optical degradation of the constituent members of the light emitting device can be efficiently prevented.

The end portion of the resin layer at the opposite side of the light emitting element may be located either at an inner side of the outer edge, in conformity to the outer edge, or at an outer side of the outer edge of the sealing member to be described below. Of those, it is preferable to dispose the end portion of the resin layer in conformity to the outer edge, or at an outer side of the outer edge of the sealing member. With this arrangement, the contact area between the resin layer and the sealing member can be easily secured, so that the sealing member can be adhered more tightly to the light emitting device, particularly to the resin layer.

In other words, the size of the resin layer, that is, the plane area of the light emitting device in light extracting direction may be similar, larger, or smaller than the plane area of the sealing resin member, excluding the plane area of the light emitting element. Particularly, the size of the first resin member may be about ⅕ to 3 times, preferably about ¼ to 3 times, and more preferably ⅓ to 1.5 times of the plane area of the sealing resin member excluding the plane area of the light emitting element. Thus, with a large planar dimension of the resin layer, the contact area with the sealing member increases as described later, so that due to the adhesion of both, the adhesion of the sealing member of the light emitting device can be further enhanced.

The resin layer may be disposed, for example, with a thickness in a range of about several micrometers to several hundred micrometers. Particularly, portions in contact with the light emitting element preferably have a thickness corresponding to or less than the height of the side surfaces of the light emitting element. In the case where the resin layer is disposed in the whole portion of the opening, the portion in contact with the periphery of the opening preferably has a thickness not exceeding the depth of the opening. Preferably the thickness of the first resin member decreases from the light emitting element outward (outer side with respect to the canter of the light emitting element).

The resin layer can be formed for example by using a resin having its base polymer of, a silicone resin composition, a modified silicone resin composition, an epoxy resin composition, a modified epoxy resin composition, an acrylic resin composition, a silicone resin, an epoxy resin, a urea resin, a fluororesin, or a hybrid resin containing one or more of those resins. Of those, a resin containing a silicone resin, an epoxy resin, or the like as its base polymer is preferable. In the specification, the term "a base polymer" means a resin having a highest content of the materials constituting the resin layer. The resin layer preferably contains, for example, a reflective material and/or diffusion material such as $SiO_2$, $TiO_2$, $Al_2O_3$, $ZrO_2$, and MgO. With this arrangement, light can be reflected sufficiently.

The resin layer may be made of a single material or a combination of two or more materials. With this arrangement, the reflectance of light can be adjusted and also the linear expansion coefficient of the resin can be adjusted.

Particularly, the resin layer is preferably formed, including the same polymer as in the sealing member as described above, more particularly, including the same polymer constituting the base polymer of the resin layer, and more preferably including the same polymer of the base polymer of the sealing member as the base polymer of the resin layer. With this arrangement, at the portion where the sealing member is in contact with the resin layer, suitability and compatibility of the both resin members are preferable, so that the adhesion with the resin layer can be further secured, and strong adhesion of the sealing member in the light emitting device can be realized.

The through holes are preferably made larger than the resin layer. Because, at the time of stacking the first substrate member and the second substrate member, the larger through-holes allows adhesion between the first substrate member and the second substrate member without interference by the resin layer.

Sealing Member

The sealing member seals (covers) each light emitting element on the flexible substrate member. One light emitting element is preferably covered with one sealing member, but two or more light emitting elements may be enclosed by one sealing member. In this case, the first light emitting elements of the first light emitting device and the second light emitting elements of the second light emitting device may be sealed by the same sealing member (for example, in a line shape). At this time, the first light emitting elements and the second light emitting elements can be driven by one driving circuit or can be individually driven by different driving circuits. The sealing member preferably has transparency to the light from the light emitting element and light resistance and electrical insulation properties. The sealing member is preferably arranged to cover all the openings of the covering layer described above, but may be arranged not to cover some of the openings. In the specification, the term "transparency to light" means properties of transmitting about 60% or greater emission of the light emitting element, more preferably 70% or greater or 80% or greater of light emitted from the light emitting element.

The sealing member can be formed for example by using a silicone resin composition, a modified silicone resin composition, an epoxy resin composition, a modified epoxy resin composition, an acrylic resin composition, a silicone resin, an epoxy resin, a urea resin, a fluororesin, or a hybrid resin containing one or more of those resins.

The sealing member preferably includes a wavelength converting member such as a fluorescent material capable of absorbing light from the light emitting element and emitting light of different wavelength. Examples of such a wavelength converting member include an oxide-based fluorescent material, a sulfide-based fluorescent material, and a nitride-based fluorescent material. For example, in the case where a gallium nitride based light emitting element to emit blue light is used as the light emitting element, fluorescent materials to absorb blue light, such as a YAG-based fluorescent material or a LAG-based fluorescent material to emit yellow to green light, a SiAlON-based fluorescent material (β-sialon-based fluorescent material) to emit green light, and a SCASN-based fluorescent material and a CASN-based fluorescent material to emit red light, are preferably used singly or in combination. Particularly, for the light emitting devices used for the display devices such as backlights of liquid crystal displays and TV-screens, a SiAlON-based fluorescent material and a SCASN-based fluorescent material are preferably used singly or in combination. Also, for lighting applications, a YAG-based fluorescent material or a LAG-based fluorescent material and a SCASN-based fluorescent material or a CASN-based fluorescent material are preferably used in combination.

The sealing member may contain a light diffusing agent (barium sulfate, titanium oxide, aluminum oxide, silicon oxide, or the like).

The shape of the sealing member is not specifically limited, but in view of light luminous intensity distribution and directivity of the light emitted from the light emitting element, a concave lens shape or a convex lens shape is preferably employed. Thus, the sealing member may have a hemispherical shape or a semicircular column shape elongated in the longitudinal direction of the substrate member, among those, a hemispherically-shaped convex lens shape is most preferably employed.

The size of the sealing member is not specifically limited and appropriately adjusted in view of the brightness, directivity, etc., of the light emitting device. Particularly, the sealing member preferably has a size which can secure wider contact area with the first resin member, but in the case where a flexible substrate member is employed for the substrate member, a size which does not impair the flexibility of the flexible substrate member is preferable. For example, the sealing member preferably has a size which allows the complete covering of the light emitting element or greater, with a diameter or length of about twice or greater, more preferably not greater than about eight times, further preferably about five to six times greater with respect to the length of a side of the light emitting element. More specifically, a side (or diameter) of about 1 mm to 4 mm can be employed.

The sealing member may be disposed with its outer edge arranged on the covering layer, or in the opening of the covering layer.

As long as covering the light emitting element, the sealing member may not be directly in contact with the light emitting element and may have a space between the light emitting element, or the sealing member is arranged so that over the light emitting element, it contacts the light emitting element, but at the outer periphery of the light emitting element, it is not necessarily directly in contact with the covering layer which constitutes the substrate member and with the wiring portions, and disposed via the resin layer to be described later.

Also, in the case where two light emitting devices are stacked in use, the first sealing member and the second sealing member may be disposed on the corresponding light emitting devices prior to stacking, or the first sealing member and the second sealing member may be disposed after stacking the two light emitting devices. More specifically, in the case where the first light emitting device having the first sealing member which seals the first light emitting elements is stacked on the second light emitting device having the second sealing member which seals the second light emitting elements, after stacking the first light emitting device on the second light emitting device, the second sealing member may be formed to seal the second light emitting elements. In this case, the peripheral portions of the second sealing member may cover the first substrate member of the first light emitting device. That is, the second sealing member may be disposed continuously on the first substrate member of the first light emitting device and the second substrate member of the second light emitting device. With this arrangement, adhesion of the first substrate member and the second adhesive member can be further enhanced.

Advantageous Features

At least the second substrate member of the light emitting device according to the present embodiment defines a plurality of through-holes. With this arrangement, a stacked assembly of the light emitting devices can be obtained by attaching the second light emitting device to the first light emitting device, and thus, the density of the light emitting elements can be increased in comparison to a single light emitting device. Further, the first and the second light emitting devices can be operated separately, so that the light emitting elements can be configured to create various patterns of light. Accordingly, the brightness can be easily adjusted to match usage requirements.

Also, the first substrate and the second substrate may be designated for different emission colors. For example, the first substrate member is designated for a white emission, and the second substrate member is designated for a red emission, thus, emission of an incandescent lamp color suitable for lighting applications can be realized. For applications for liquid crystal display backlight, two substrate members are respectively designated to C (cyan) and R (red), or M (magenta) and G (green), or Y (yellow) and B (blue), which allows easy adjustments of the value of electric current set for each color. Further, the third substrate member may be employed and three substrates are stacked, thus allows a combination of RGB.

The light emitting device according to the embodiments includes, as described above, a flexible substrate member which uses a flexible base member, and while maintaining/improving the performance such as brightness and operation life time etc., required in the conventional usage, a significant downsizing and reduction in weight can be realized. That is, the light emitting device according to the embodiments of the present invention at least includes a substrate and a plurality of light emitting elements and sealing members, and can realize a weight of 1 $g/cm^2$ or less, preferably 0.7 $g/cm^2$ or less, 0.4 $g/cm^2$ or less, or 0.1 $g/cm^2$ or less. More preferably, even with related components, such as a terminal for furnishing an external power source, a protective element, a fuse, a resistance etc., necessary for operating the light emitting device as designed, a weight of 1 $g/cm^2$ or less can be realized, and more preferably 0.7 $g/cm^2$ or less, 0.4 $g/cm^2$ or less, or 0.1 $g/cm^2$ or less can be realized. Thus, a light emitting device of very small weight can be obtained.

From a different point of view, for example, in the use as an alternative to the straight-tube type fluorescent lamps, for example, about 90 to 120 light emitting elements (for example 100 light emitting elements) can be arranged at uniform intervals with respect to the substrate member of about 120 cm×1.5 cm area, or about 50 to 70 light emitting elements (for example 60 light emitting elements) can be arranged at uniform intervals with respect to the substrate member of about 60 cm×1.7 cm area, and in the light emitting devices having such conformations, a total weight of 10 g or less, preferably 9 g or less, 8 g or less, or 7 g or less can be realized. More preferably, even with related components, such as a terminal for furnishing an external power source, a protective element, a fuse, a resistance etc., necessary for operating the light emitting device as designed, a total weight of 10 g or less, more preferably 9 g or less, 8 g or less, or 7 g or less can be realized.

The embodiments according to the present invention will be described below with reference to the drawings.

Embodiment 1

Figure 1B:
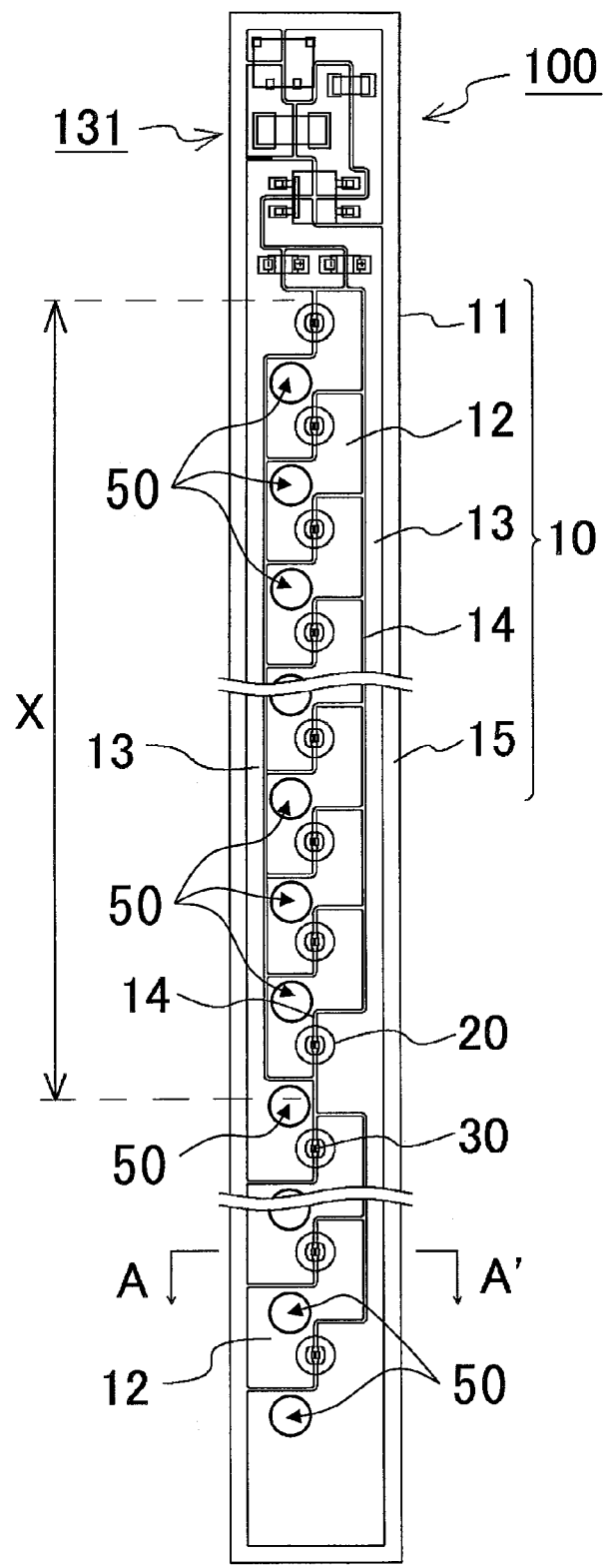
FIG. 1B is a schematic plan view showing a light emitting device according to an embodiment.

The light emitting device 100 according to Embodiment 1 includes, as shown in FIG. 1A and FIG. 1B, the substrate member 10, the light emitting elements 30 arranged on the surface of the substrate member 10, and the sealing members 20 which are disposed on the substrate member 10 and cover the respective light emitting elements 30.

The substrate member 10 has a stacked layer structure made up of a flexible base member 11 made of a polyimide (about 25 μm thickness), a plurality of wiring portions 12 (copper foil, about 35 μm thickness) arranged on one surface of the base member 11 and spaced apart from each other by a groove portion 14, and an insulating covering layer 15 (about 15 μm thickness and made of an epoxy-based resin containing titanium oxide) disposed over them, which are stacked via an adhesive agent (an epoxy-based adhesive agent). Of the wiring portions 12, the wiring portion 13 extending in the longitudinal direction is connected to the terminal which allows supply of electricity to the wiring portion 12.

The substrate 10 defines 120 through holes 50. Each through-hole 50 is defined to penetrate from the upper surface to the back-surface of the substrate member 10. The 120 through holes 50 are arranged along the longitudinal direction. Each of the through-holes 50 is formed on an inner side of the wiring portion 12, 13, in a plan view. The pitch of the 120 through-holes 50 is the same as the pitch of the 120 light emitting elements 30. The through holes 50 are defined in a similar size with the sealing members 20.

The substrate member 10 has a size (an area of 171.15 cm$^2$) of 1141 mm (length)×15 mm (width)×0.09 mm (thickness).

In order to establish electrical connection with the light emitting element 30, a groove portion 14 between the wiring portions 12 and the wiring portion 12 are partially exposed through the openings formed in the covering layer 15 in a region of the substrate member 10.

The wiring portions 12 respectively have a crank shape and the groove has a width of about 0.3 mm. This indicates that the wiring portions 12, 13 are disposed with a total area of about 75% with respect to the entire area of the upper surface of the substrate member.

The light emitting element 30 includes a semiconductor structure, a p-side electrode, and an n-side electrode. In the semiconductor structure, the p-type semiconductor layer and the light emitting layer are partially removed to expose the n-type semiconductor layer, and an n-side electrode is formed on the exposed surface. A p-side electrode is formed on the upper surface of the p-type semiconductor layer. Thus, the n-side electrode and the p-side electrode are formed on the same surface side with respect to the semiconductor structure.

The light emitting element 30 as described above is arranged on a pair of the wiring portions 12 which are partially exposed through the openings formed in the covering layer 15 of the substrate member 10, with the surface having the n-side electrode and the p-side electrode facing downward, and is electrically connected to the wiring portions via the bonding member 35.

The light emitting elements 30 are arranged such that, for example, in a region indicated by X in FIG. 1B, 24 light emitting elements 30 are arranged in series at uniform intervals, and further, 5 sets of the series arrangements are arranged in parallel, thus, a total of 120 light emitting elements are arranged in a linear fashion.

The resin layer 40 is arranged on the upper surface of the substrate member 10 around the region where the light emitting element 30 is disposed and a part of the region directly under the light emitting element 30. The resin layer 40 is, for example, made of a silicone resin containing about 30 weight % of titanium oxide.

The resin member 40 is arranged from the outer edge of the light emitting element 30 and on the bonding member 35 to the outer periphery of the light emitting element, on the all portion in the opening of the covering layer 15 and further onto a part of the covering layer 15. The thickness of the resin layer 40 can be approximately the same as the height of the light emitting element 30 at the light emitting element 30 side, and can be gradually reduced on the bonding member 35 to reach about 10 μm thickness on the covering layer 15. The length of the resin layer 40 from the end portion of the light emitting element 30 side to the end portion of the opposite side is about 1 mm.

In the case where the resin layer 40 is arranged at the outer periphery of the light emitting element 30 with a relatively large area, the sealing member 20 can be in contact with the resin layer 40 at a large contact area, so that the sealing member 20 can be firmly adhered to the substrate 10. Further, the resin layer 40 has a reflectance higher than that of the bonding member 35 and the wiring portion 12, so that extraction of light from the light emitting element can be performed more efficiently.

The sealing member 20 is disposed on the substrate 10 mounted with the light emitting element 30, on the portions including the light emitting element 30, the resin layer 40 arranged around the light emitting element 30, and a portion of the covering layer 15 disposed from directly under the resin layer 40 on the covering layer 15 arranged on an outer side of the light emitting element 30. The sealing member 20 is, for example, made of a silicone resin containing a total of about 10 weight % of fluorescent materials (LAG and SCASN). That is, the sealing member 20 contains the same type of polymer used to constitute the resin layer.

The outer edge a of the sealing member 20 is arranged on the covering layer 15 of the substrate 10. The sealing member 20 is formed in a hemispherical shape by potting etc. The diameter of the sealing member 20 is, for example, about 3.5 mm.

The sealing member 20 is disposed containing the same base polymer as in the resin layer 40, thus, the adhesion between the sealing member 20 and the resin layer 40 can be secured. Particularly, in the light emitting device 100, the resin layer 40 and the sealing film 15 are in contact with each other with the entire surface of the resin layer 40 and all the side surfaces of the resin layer 40 arranged on the covering layer 15, and thus, a further contact area between the resin layer 40 and the sealing member 20 can be secured. Moreover, the resin layer 40 and the sealing member 20 are arranged with containing the same base polymer, so that good suitability and compatibility between the resin layer 40 and the sealing member 20 can be obtained and thus further firm adhesion can be realized.

Moreover, the surfaces and the interface between the bonding member 35 and the wiring portion 12 and the interface between the wiring portion 12 and the covering layer 15 can be covered with the resin layer 40, so that optical degradation of those members and detachment or the like, due to the optical degradation can be effectively prevented.

Five light emitting devices having the structure as described above were prepared and the total weight of the five light emitting devices was measured. The obtained total weight was then divided by five to obtain a total weight of one light emitting device. As a result, 6.942 g was obtained. Accordingly, the light emitting device has a weight of 0.04 g/cm$^2$ and the light emitting elements are arranged at 0.7 light emitting elements/cm$^2$.

Also, the brightness of the light emitting device 100 was about 3,000 lm at a color temperature of 5,000 K.

The light emitting device according to the embodiments of the present invention can realize a significant downsizing and reduction in weight along with improvements in the performance (brightness etc.) and operation life time etc., compared to that of the conventional fluorescent lamps or the like. As a result, the light emitting device can be applied across a wider range of various conformations and applications.

Figure 1C:
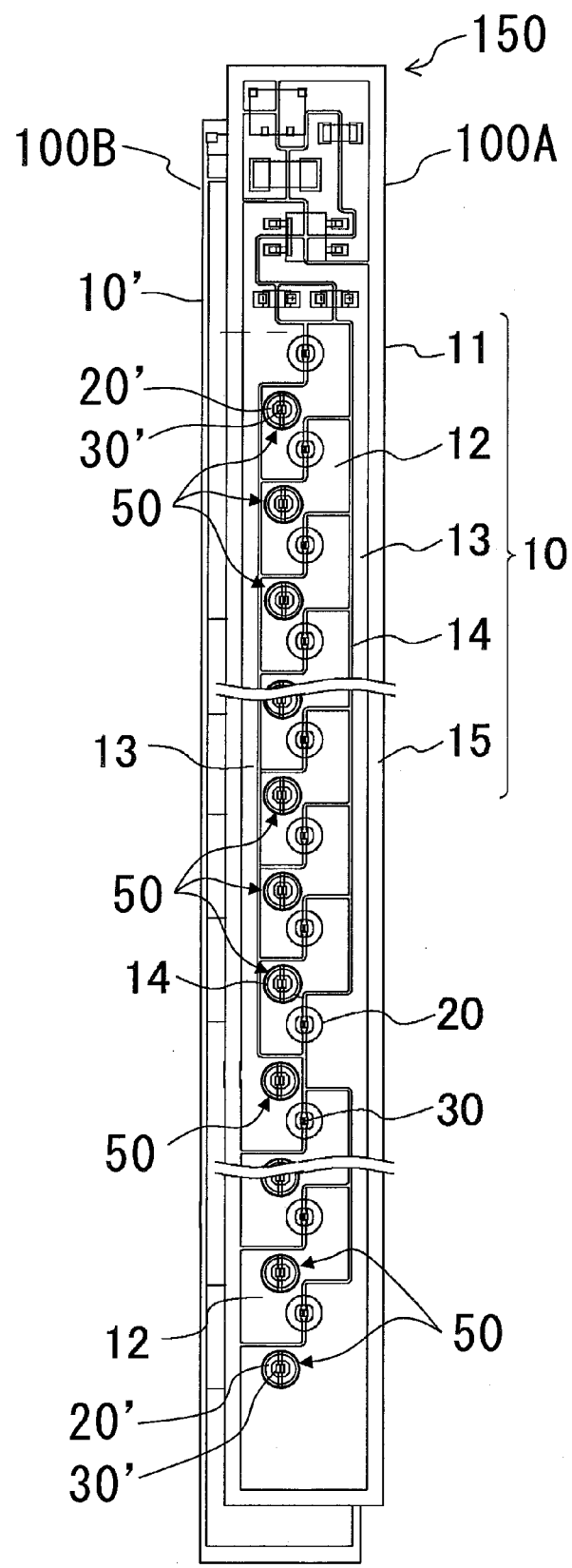
FIG. 1C is a schematic plan view showing an embodiment of a stacked assembly of a plurality of light emitting devices.

FIG. 1C is a plan view of the stacked assembly 150 provided with the first light emitting device 100A and the second light emitting device 100B. The first light emitting device 100A and the second light emitting device 100B each has a structure similar to that of the light emitting device 100 as described above. The upper surface of the second light emitting device 100B is attached to the back-surface of the first light emitting device 100A.

As shown in FIG. 1C, the sealing members 20' of the second light emitting device 100B are accommodated in the through-holes 50 of the first light emitting device 100A respectively. With this arrangement, emission light from the light emitting elements 30' of the second light emitting device 100B can be extracted from the through-holes 50 of the first light emitting device 100A.

In the present embodiment, as shown in FIG. 1B, the through-holes 50 of the first light emitting device 100A are arranged offset from the light emitting elements 30 in the longitudinal direction and in the lateral direction. Accordingly, as shown in FIG. 1C, the light emitting elements 30 of the first light emitting device 100A and the light emitting elements 30' of the second light emitting device 100B are arranged in zigzag manner.

Note that the positions of the through-holes 50 relative to the light emitting elements 30 can be set appropriately. For example, each of the through-holes 50 may be defined between each corresponding two light emitting elements 30 in the longitudinal direction. In this case, the light emitting elements 30 of the first light emitting device 100A and the light emitting elements 30' of the second light emitting device 100B are arranged in a single row in the longitudinal direction. Also, the through-holes 50 may be arranged at a side of corresponding ones of the light emitting elements 30 in the lateral direction. In this case, the light emitting elements 30 of the first light emitting device 100A and the light emitting elements 30' of the second light emitting device 100B are arranged in two rows parallel to each other.

Herein, the substrate member 10 is an example of "first substrate" included in the first light emitting device 100A and the substrate member 10' is an example of "second substrate" included in the second light emitting device 100B. The sealing member 20 is an example of "first sealing member" included in the first light emitting device 100A and the second sealing member 20' is an example of "second sealing member" included in the second light emitting device 100B. Also, the light emitting element 30 is an example of "first light emitting element" included in the first light emitting device 100A and the light emitting element 30' is an example of "second light emitting element" included in the second light emitting device 100B.

The weight per unit area of the stacked assembly 150 was 0.08 g/cm$^2$. In the stacked assembly 150, the number of the light emitting elements per unit area was 1.4 light emitting elements/cm$^2$. Also, the brightness of the stacked assembly 150 was about 6,000 lm at a color temperature of 5000 K. As described above, it is confirmed that an improvement in the brightness can be easily obtained with stacking a plurality of light emitting devices 100.

Embodiment 2

Figure 2A:
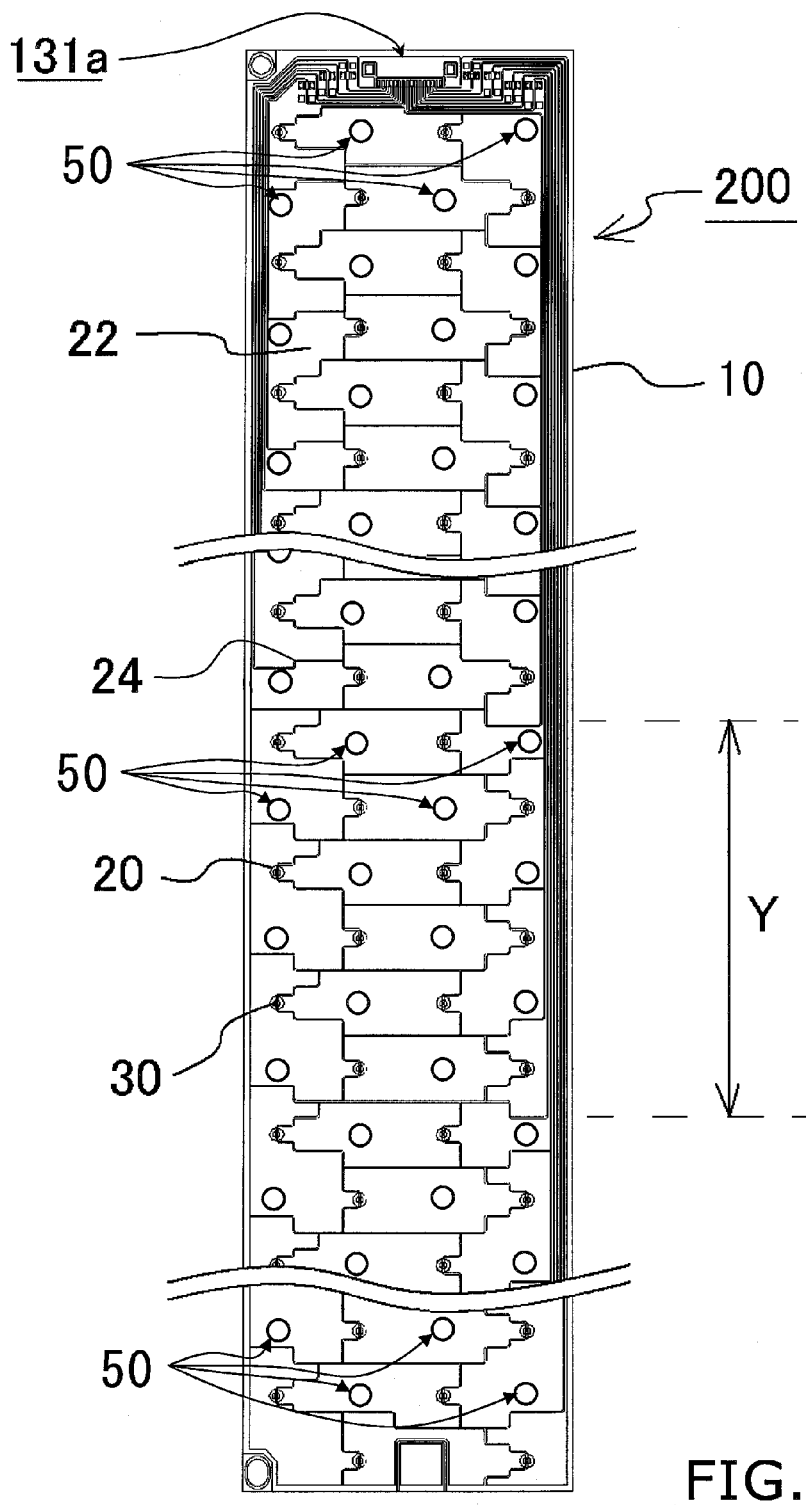
FIG. 2A is a schematic plan view showing another embodiment of a light emitting device.
Figure 2B:
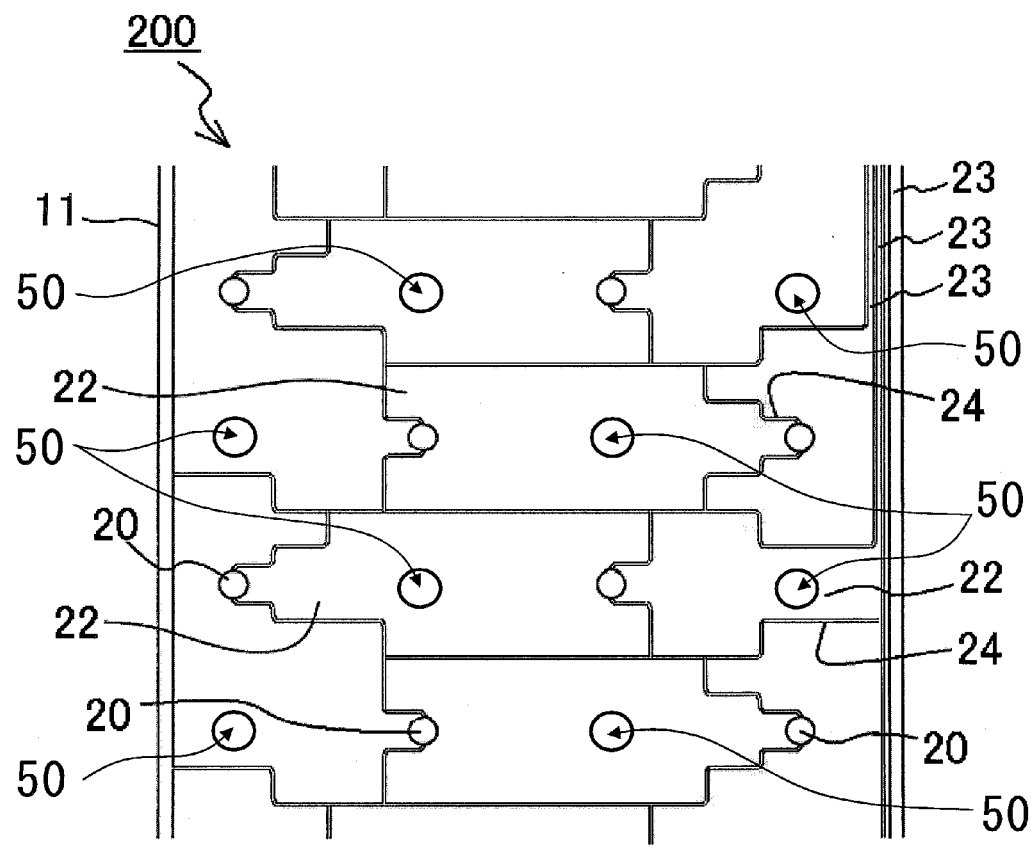
FIG. 2B is a partially enlarged view of FIG. 2A.

The light emitting device 200 according to Embodiment 2 has a similar structure as in the light emitting device 100 of Embodiment 1 except that, for example as shown in FIGS. 2A and 2B, the pattern of the groove portion 24 which separates the wiring portions 22 does not have a simple crank-shape but has step-wise bend portions in both lateral direction and longitudinal direction, and accordingly, the wiring portion 22 is made into crank-like shapes with a plurality of recessed portions and protruded portions in a top view, and also, in order to supply electricity to the wiring portion 22, a part of the wiring portion 22 is integrally formed with the wiring portion 23 extending in the longitudinal direction and is connected to the terminal 131a.

The light emitting device 200 has a substrate member with a size (an area of 538.42 cm$^2$) of 679.4 mm (length)×79.25 mm (width)×0.09 mm (thickness), and for example, 12 light emitting elements 30 are arranged in series in a region indicated by Y in FIG. 2A, and further, seven of the in-series arrangements are disposed to have a total of 84 units of the light emitting elements on the substrate member 10.

The substrate 10 defines 84 through holes 50. The 84 through-holes 50 are defined at symmetrical location to the 84 light emitting elements 30. The pitch of the through holes 50 in the longitudinal direction is similar to the pitch of the light emitting elements 30 in the longitudinal direction. The through holes 50 are defined in a similar size with the sealing members 20.

The wiring portions 22 and 23 are disposed about 85% with respect to the whole area of the upper surface of the substrate member.

Five light emitting devices having the structure as described above were prepared and the total weight of the five light emitting devices was measured. The obtained total weight was then divided by five to obtain a total weight of one light emitting device. As a result, 21.84 g was obtained. Accordingly, the light emitting device has a weight of 0.04 g/cm$^2$ and the light emitting elements are arranged at a density of 0.16 light emitting elements/cm$^2$.

Also, the brightness of the light emitting device 200 was about 9,000 lm at a color temperature of 20,000 K.

Further, although not shown in the figure, the two light emitting devices 200 are overlapped to each other to form a stacked assembly, the brightness can be easily improved. More specifically, in the brightness of the stacked assembly of two light emitting devices 200, the light emitting elements are arranged at 0.32 light emitting elements/cm$^2$, and the brightness is about 18,000 lm at a color temperature of 20,000 K.

Embodiment 3

Figure 3:
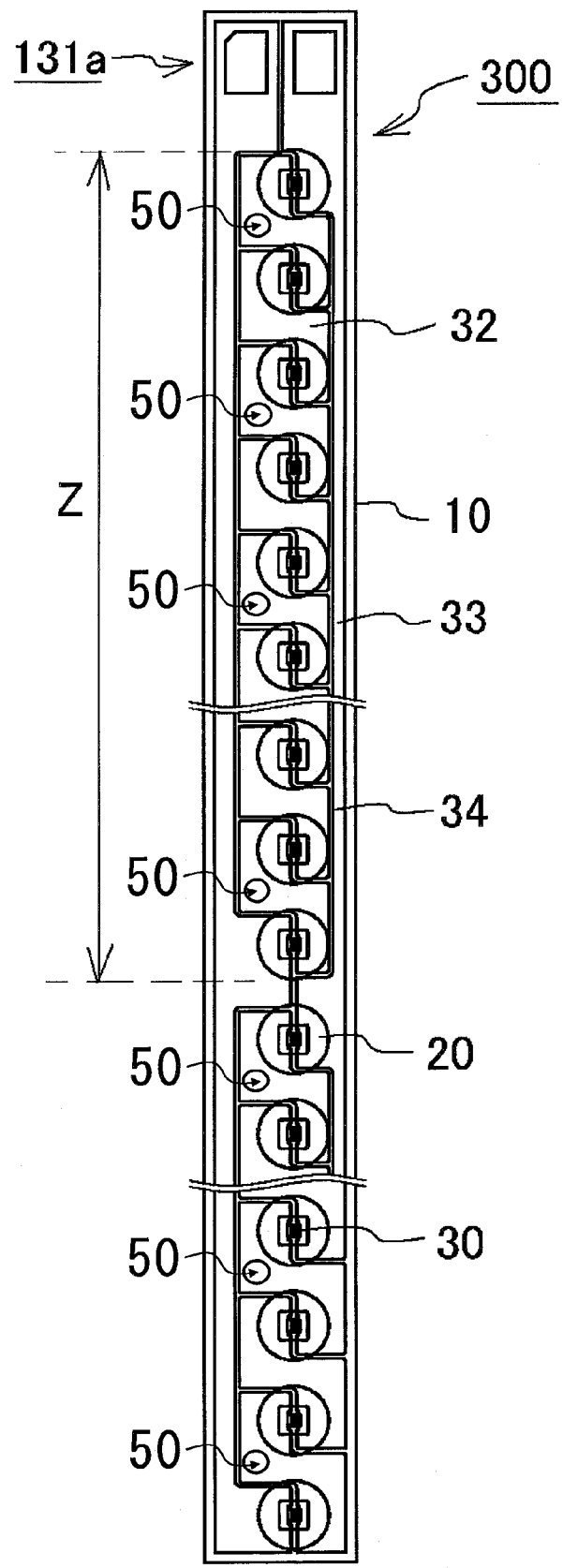
FIG. 3 is a schematic plan view showing another embodiment of a light emitting device.

The light emitting device 300 according to Embodiment 3 has a similar structure as in the light emitting device 100 of Embodiment 1 except that, for example as shown in FIG. 3, the pitch of the through holes 50 is not the same as the pitch of the light emitting elements 30, the pattern of the groove portion 34 which separates the wiring portions 32 is arranged in a crank shape extending from an upper side of one side to a lower side of the other side in the longitudinal direction, and also, in order to supply electricity to the wiring portion 32, the wiring portion 33 extends in the longitudinal direction of the light emitting device 300 and is connected to the terminal 131a.

In the light emitting device 300, on a substrate with a size (area of 24.89 cm²) of 340.96 mm (length)×7.3 mm (width)×0.09 mm (thickness), 18 units of the light emitting elements 30 are arranged in series, for example, in a region indicated by Z in FIG. 3, and further, four in-series arrangements are arranged in parallel, thus, a total of 72 units of the light emitting elements are arranged.

The substrate 10 defines 36 through holes 50. The 36 through holes 50 are arranged along the longitudinal direction of the substrate member 10. The pitch of the through holes 50 in the longitudinal direction is two-times larger than the pitch of the light emitting elements 30 in the longitudinal direction. The size of the through holes 50 is larger than the light emitting elements 30 and smaller than the sealing member 20.

The wiring portions 32, 33 are disposed with a total area of about 77% with respect to the whole area of the substrate.

Five light emitting devices having the structure as described above were prepared and the total weight of the five light emitting devices was measured. The obtained total weight was then divided by five to obtain a total weight of one light emitting device. Thus, 1.01 g was obtained. Accordingly, the light emitting device has a weight of 0.04 g/cm² and the light emitting elements are arranged at 2.89 light emitting elements/cm².

Also, the brightness of the light emitting device 300 was about 1,800 lm at a color temperature of 20,000 K.

Further, although not shown in the figure, the two light emitting devices 300 are overlapped to each other to form a stacked assembly, and with this arrangement the brightness can be easily improved. More specifically, in the brightness of the stacked assembly of two light emitting devices 300, the light emitting elements are arranged at 5.78 light emitting elements/cm², and the brightness is about 2,700 lm at a color temperature of 20,000 K.

Embodiment 4

Figure 4:
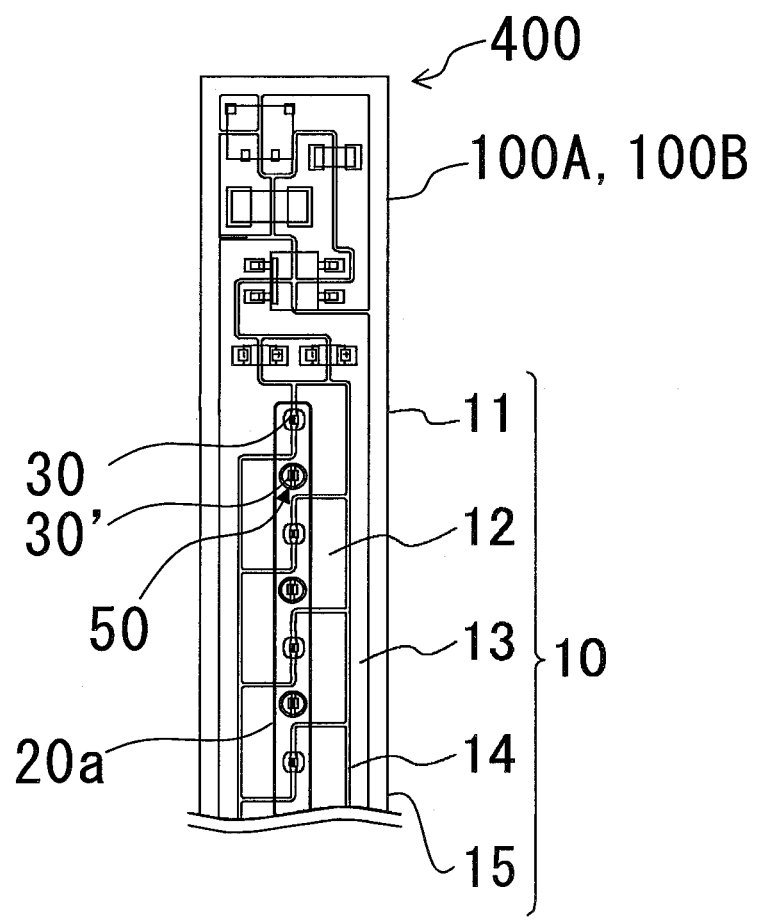
FIG. 4 is a schematic plan view showing another embodiment of a light emitting device.

The stacked assembly 400 according to Embodiment 4 includes, as shown in FIG. 4, the first light emitting device 100A and the second light emitting device 100B which are stacked with the outer edges match each other. The first light emitting device 100A includes a plurality of through-holes 50 each defined between two adjacent light emitting elements 30. One of the plurality of the light emitting elements 30' of the second light emitting device 100B is arranged in one of the plurality of the through-holes 50 respectively. Accordingly, in the stacked assembly 400, the light emitting elements 30 of the first light emitting device 100A and the light emitting elements 30' of the second light emitting device 100B are arranged on one straight line.

The stacked assembly 400 also includes a sealing member 20a formed in a linear shape along its longitudinal direction. The sealing member 20a seals the light emitting elements 30 of the first light emitting device 100A and the light emitting element 30' of the second light emitting device 100B. That is, the light emitting elements 30 and the light emitting elements 30' are not sealed individually but are sealed by one sealing member 20a. Such a sealing member 20a can be formed by applying a resin material along the longitudinal direction.

In FIG. 4 shows an example in which the light emitting elements 30 and the light emitting elements 30' are aligned on a straight line, but the light emitting elements 30 and the light emitting elements 30' may be arranged in two lines as shown in FIG. 1C. In this case, forming the sealing member 20a in a zigzag shape allows covering the light emitting elements 30 and the light emitting elements 30' with one sealing member 20a.

The light emitting device according to each of the illustrated embodiments can be used for various kinds of light sources, such as illumination light sources, light sources for various kinds of indicators, light sources for automobile use, light sources for displays, back light sources for liquid crystal displays, light sources for sensors, signals, automobile use, channel control characters for channel boards.

As described above, it should be obvious that various other embodiments are possible without departing the spirit and scope of the present invention. Accordingly, the scope and spirit of the present invention should be limited only by the following claims.

What is claimed is:

1. A stacked assembly of light emitting devices comprising:
   a first light emitting device including
      a first substrate member extending in a longitudinal direction and defining a plurality of through-holes, and
      a plurality of first light emitting elements arranged on an upper surface of the first substrate member; and
   a second light emitting device arranged to overlap with the first light emitting device, the second light emitting device including
      a second substrate member extending in the longitudinal direction, and
      a plurality of second light emitting elements arranged on an upper surface of the second substrate and exposed respectively through the through-holes; and
   a sealing member sealing the first light emitting elements and the second light emitting elements, the sealing member including a first sealing member sealing the first light emitting elements and a second sealing member sealing the second light emitting elements, the second sealing member being disposed continuously over a part of the upper surface of the second substrate member, which is exposed through a corresponding one of the through-holes, and a part of the upper surface of the first substrate member adjacent to the corresponding one of the through-holes.

2. The stacked assembly of light emitting devices according to claim 1, wherein
   a sum of weights of the first substrate member, the first light emitting elements, and the first sealing members is 1 g or less per 1 cm² of a main surface of the first substrate member.

3. The stacked assembly of light emitting devices according to claim 1, wherein
   a number of the first light emitting elements per 1 cm² of a main surface of the first substrate member is 0.05 or greater and 10 or below.

4. The stacked assembly of light emitting devices according to claim 1, wherein
   brightness of the first light emitting elements at a color temperature 20,000 K is 9,000 lm or greater.

5. The stacked assembly of light emitting devices according to claim 1, wherein
   the first substrate member includes
      a flexible base member,
      a plurality of wiring portions disposed on a main surface of the base member, and
      a covering layer disposed on the wiring portions and defining a plurality of openings through which a part of each of the wiring portions is respectively exposed, the wiring portions covering 50% or greater of an area of the main surface of the base member.

6. The stacked assembly of light emitting devices according to claim 1, wherein
the first substrate member includes
a flexible base member,
a plurality of wiring portions disposed on a main surface of the base member, and
a covering layer disposed on the wiring portions and defining a plurality of openings through which a part of each of the wiring portions is respectively exposed,
the flexible base member having a thickness of 10 μm to 100 μm.

7. The stacked assembly of light emitting devices according to claim 1, wherein
a length of the first substrate member in the longitudinal direction is in a range of 5 times or greater and 200 times or less with respect to a length of the first substrate member in a lateral direction which is perpendicular to the longitudinal direction.

8. The stacked assembly of light emitting devices according to claim 1, wherein
the first light emitting elements are configured and arranged to emit lights having a different color from lights emitted from the second light emitting elements.

9. A stacked assembly of light emitting devices comprising:
a first light emitting device including
a first flexible substrate member defining a plurality of through-holes, and
a plurality of first light emitting elements arranged on an upper surface of the first flexible substrate member; and
a second light emitting device arranged to overlap with the first light emitting device, the second light emitting device including
a second flexible substrate member, and
a plurality of second light emitting elements arranged on an upper surface of the second flexible substrate member and exposed respectively through the through-holes; and
a sealing member sealing the first light emitting elements and the second light emitting elements, the sealing member including a first sealing member sealing the first light emitting elements and a second sealing member sealing the second light emitting elements, the second sealing member being disposed continuously over a part of the upper surface of the second flexible substrate member, which is exposed through a corresponding one of the through-holes, and a part of the upper surface of the first flexible substrate member adjacent to the corresponding one of the through-holes.

10. The stacked assembly of light emitting devices according to claim 9, wherein
a sum of weights of the first flexible substrate member, the first light emitting elements, and the first sealing members is 1 g or less per 1 $cm^2$ of a main surface of the first flexible substrate member.

11. The stacked assembly of light emitting devices according to claim 9, wherein
a number of the first light emitting elements per 1 $cm^2$ of a main surface of the first flexible substrate member is 0.05 or greater and 10 or below.

12. The stacked assembly of light emitting devices according to claim 9, wherein
brightness of the first light emitting elements at a color temperature 20,000 K is 9,000 lm or greater.

13. The stacked assembly of light emitting devices according to claim 9, wherein
the first flexible substrate member includes
a flexible base member,
a plurality of wiring portions disposed on a main surface of the base member, and
a covering layer disposed on the wiring portions and defining a plurality of openings through which a part of each of the wiring portions is respectively exposed,
the wiring portions covering 50% or greater of an area of the main surface of the base member.

14. The stacked assembly of light emitting devices according to claim 9, wherein
the first flexible substrate member includes
a flexible base member,
a plurality of wiring portions disposed on a main surface of the base member, and
a covering layer disposed on the wiring portions and defining a plurality of openings through which a part of each of the wiring portions is respectively exposed,
the flexible base member having a thickness of 10 μm to 100 μm.

15. The stacked assembly of light emitting devices according to claim 9, wherein
a length of the first flexible substrate member in a longitudinal direction is in a range of 5 times or greater and 200 times or less with respect to a length of the first flexible substrate member in a lateral direction which is perpendicular to the longitudinal direction.

* * * * *